(12) United States Patent
Liu

(10) Patent No.: US 8,058,095 B2
(45) Date of Patent: Nov. 15, 2011

(54) ENCAPSULATED PHASE CHANGE CELL STRUCTURES AND METHODS

(75) Inventor: Jun Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 12/489,957

(22) Filed: Jun. 23, 2009

(65) Prior Publication Data

US 2010/0320436 A1    Dec. 23, 2010

(51) Int. Cl.
*H01L 21/00* (2006.01)

(52) U.S. Cl. ......... 438/95; 438/197; 438/311; 438/238; 257/E21.006; 257/E21.17; 257/E21.32; 257/E21.267; 257/E21.304; 257/E21.435; 257/E21.577; 257/E21.645; 257/E21.646

(58) Field of Classification Search ............... 438/95, 438/197, 238, 381, 289, 127, 311, 678, 692; 257/E21.006, 17, 32, 267, 304, 435, 577, 257/645, 646

See application file for complete search history.

(56) References Cited

U.S. PATENT DOCUMENTS

| | | | |
|---|---|---|---|
| 7,456,460 B2 | 11/2008 | Burr et al. | |
| 7,488,967 B2 * | 2/2009 | Burr et al. | 257/3 |
| 7,511,984 B2 | 3/2009 | Liu | |
| 7,521,706 B2 | 4/2009 | Jeong et al. | |
| 2007/0194294 A1 | 8/2007 | Song et al. | |
| 2008/0055969 A1 | 3/2008 | Liu | |
| 2008/0108175 A1 | 5/2008 | Shin et al. | |
| 2008/0142776 A1 | 6/2008 | Seidl | |
| 2008/0258125 A1 * | 10/2008 | Liu et al. | 257/2 |
| 2009/0020739 A1 | 1/2009 | Arnold et al. | |
| 2009/0101882 A1 | 4/2009 | Chen et al. | |

OTHER PUBLICATIONS

International Search Report and Written Opinion for related PCT Application No. PCT/US2010/001666, mailed Jan. 20, 2011 (11pgs.).

* cited by examiner

*Primary Examiner* — David Nhu
(74) *Attorney, Agent, or Firm* — Brooks, Cameron & Huebsch, PLLC

(57) ABSTRACT

Methods and devices associated with phase change cell structures are described herein. In one or more embodiments, a method of forming a phase change cell structure includes forming a substrate protrusion that includes a bottom electrode, forming a phase change material on the substrate protrusion, forming a conductive material on the phase change material, and removing a portion of the conductive material and a portion of the phase change material to form an encapsulated stack structure.

10 Claims, 5 Drawing Sheets

ENCAPSULATED PHASE CHANGE CELL STRUCTURES AND METHODS

TECHNICAL FIELD

The present disclosure relates generally to semiconductor memory devices and methods, and more particularly, to phase change cell structures and methods.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), phase change random access memory (PCRAM), and flash memory, among other types of memory.

Resistance variable memory devices, such as PCRAM devices, can include a structural phase change material such as a chalcogenide alloy, for instance, which can be programmed into different resistivity states to store data. The phase change memory cells are non-volatile and the particular data stored in a phase change memory cell can be read by sensing the cell's resistance, e.g., by sensing current and/or voltage variations based on the resistance of the phase change material.

In cases in which the resistance variable memory device includes a chalcogenide alloy, the chalcogenide alloy can exhibit a reversible structural phase change, e.g., from amorphous to crystalline. A small volume of the chalcogenide alloy can be integrated into a circuit that can allow the cell to act as a fast switching programmable resistor. This programmable resistor can exhibit greater than 40 times the dynamic range of resistivity between the crystalline state (low resistivity) and the amorphous state (high resistivity), and is also capable of exhibiting multiple intermediate states that allow multi-bit storage in each cell. That is, resistance variable memories may achieve multi-level cell (MLC) functionality via programming of memory cells to one of a number of different resistance levels.

Various previous processes used to form phase change memory cells can lead to contamination of the phase change material due to exposure of the phase change material to plasma, oxygen, and humidity, among other contaminants. These contaminants can cause a reduction in cell performance and cell failure. Also, previous formation processes can result in problems such as delamination of the phase change memory cells from the substrate, among other problems.

DETAILED DESCRIPTION

Figure 1:
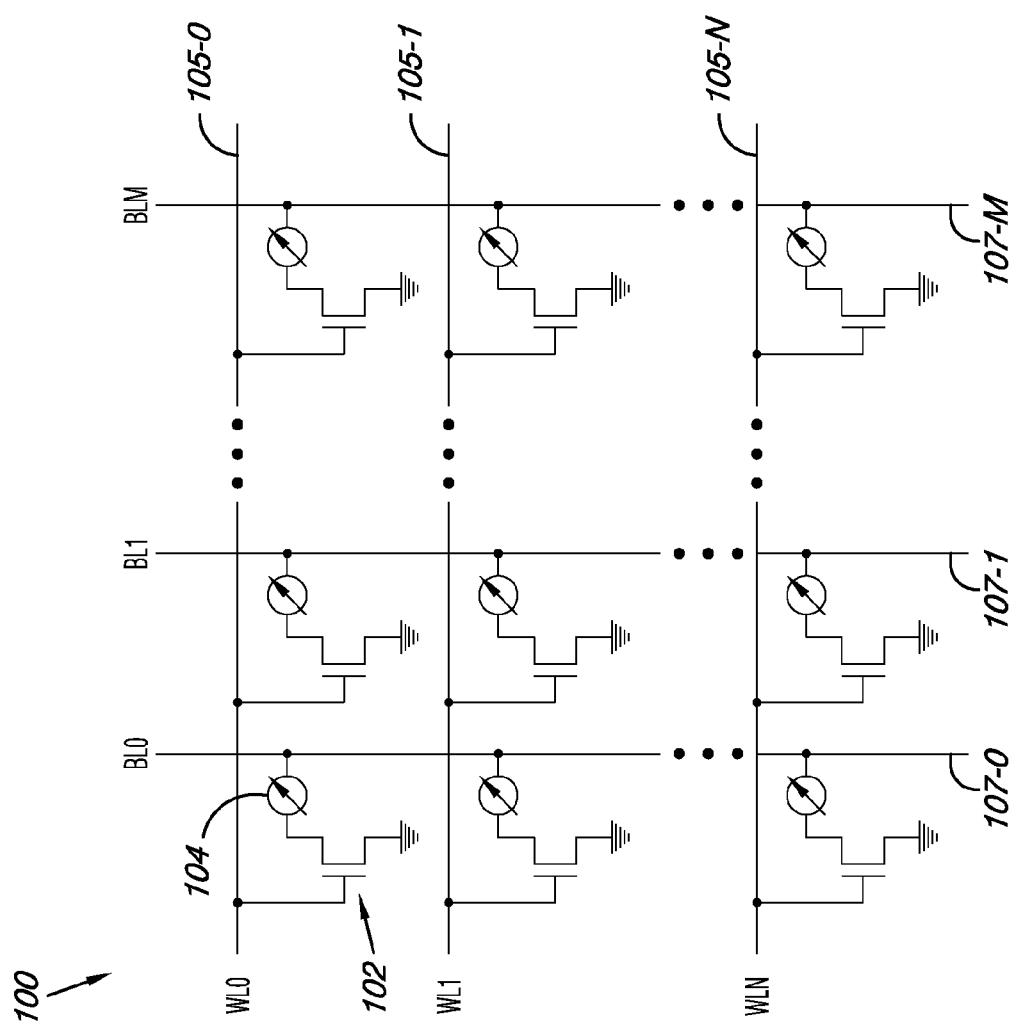
FIG. 1 is a schematic of a portion of a phase change memory array that can include phase change structures in accordance with one or more embodiments of the present disclosure.

Methods, devices, and systems associated with phase change cell structures are described herein. In one or more embodiments, a method of forming a phase change cell structure includes forming a substrate protrusion that includes a bottom electrode, forming a phase change material on the substrate protrusion, forming a conductive material on the phase change material, and removing a portion of the conductive material and a portion of the phase change material to form an encapsulated stack structure.

One or more embodiments of the present disclosure can provide various benefits, such as, reducing etch damage, contamination, and/or delamination during the formation of the phase change cell structures, among other benefits. For instance, one or more embodiments can reduce the reset current requirement for the phase change cell structures and reduce thermal crosstalk associated with phase change memory cells, which can provide various benefits including improved data reliability and retention and increased read and/or write times, among various other benefits.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. For example, 420 may reference element "20" in FIG. 4, and a similar element may be referenced as 520 in FIG. 5A. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present invention and are not to be used in a limiting sense.

As used in this disclosure, the terms "wafer" and "substrate" are used interchangeably and are to be understood as including silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

FIG. 1 is a schematic of a portion of a phase change memory array that can include phase change structures in accordance with one or more embodiments of the present disclosure. In the embodiment illustrated in FIG. 1, the memory array 100 includes a number of phase change memory cells each having an associated access device 102 and resistance variable element 104, e.g., a phase change cell structure 104. The access devices 102 can be operated, e.g., turned on/off, to access the memory cells in order to perform operations such as data programming, e.g., writing, and/or data reading operations on the resistance variable elements 104.

In the embodiment illustrated in FIG. 1, the access devices 102 are metal oxide semiconductor field effect transistors (MOSFETs). As shown in FIG. 1, a gate of each MOSFET 102 associated with each memory cell is coupled to one of a number of access lines 105-0 (WL0), 105-1 (WL1), . . . , 105-N (WLN), i.e., each access line 105-0, 105-1, . . . , 105-N is coupled to a row of phase change memory cells. The access lines 105-0, 105-1, . . . , 105-N may be referred to herein as "word lines." The designator "N" is used to indicate that a memory array can include a number of word lines. The resistance variable elements 104 can be a phase change cell structure having a phase change material that includes chalcogenide alloys such as a Germanium-Antimony-Tellurium (GST) material, e.g., a Ge—Sb—Te material such as $Ge_2Sb_2Te_5$, $Ge_1Sb_2Te_4$, $Ge_1Sb_4Te_7$, etc. The hyphenated chemical composition notation, as used herein, indicates the elements included in a particular mixture or compound, and is intended to represent all stoichiometries involving the indicated elements. Other phase change materials can include Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, and Ge—Te—Sn—Pt, among various other phase change materials.

In the embodiment illustrated in FIG. 1, each resistance variable element 104 is coupled to one of a number of data lines 107-0 (BL0), 107-1 (BL1), 1107-M (BLN), i.e., each data line 107-0, 107-1, . . . , 107-M is coupled to a column of phase change memory cells. The data lines 107-0, 107-1, . . . , 107-M may be referred to herein as "bit lines" or "sense lines." The designator "M" is used to indicate that a memory array can include a number of bit lines. For ease of addressing in the digital environment, the number of word lines 105-1, . . . , 105-N and the number of bit lines 107-1, . . . , 107-M can each be some power of two, e.g., 256 word lines by 4,096 bit lines. However, embodiments are not limited to particular numbers of word lines and/or bit lines.

In operation, appropriate voltage and/or current signals, e.g., pulses, can be applied to the bit lines 107-0, 107-1, . . . , 107-M and word lines 105-0, 105-1, . . . , 105-N in order to program data to and/or read data from the phase change memory cells of the array 100. As an example, the data stored by a phase change memory cell of array 100 can be determined by turning on an access device, e.g., 102, and sensing a current passing through the phase change cell structure, e.g., 104. The current sensed on the bit line associated with the memory cell being read, e.g., bit line 107-0, 107-1, . . . , 107-M, corresponds to a resistance level of the phase change cell structure 104, which in turn corresponds to a particular data value, e.g., a binary value such as 1, 0, 001, 111, 0101, etc.

Embodiments of the present disclosure are not limited to the example array 100 illustrated in FIG. 1. For example, as one of ordinary skill in the art will appreciate, the access device 102 associated with a particular memory cell can be a device other than a MOSFET. In some embodiments, the access device 102 can be a bipolar junction transistor (BJT) or a diode, among other types of access devices. Also, a memory array, e.g., 100, can have an architecture other than that illustrated in FIG. 1, as will be understood by one of ordinary skill in the art.

In one or more embodiments, the access device associated with the phase change memory cells in an array can be a diode. The diode can be a number of types of diodes, such as a p-n diode, a Zener diode, or a Schottky diode, among various other types of diodes.

In operation, appropriate voltage and/or current signals, e.g., pulses, can be applied to the bit lines and word lines in order to program data to and/or read data from the phase change memory cells of the array. As an example, the data stored by a phase change memory cell of array can be determined by turning on a diode access device and sensing a current passing through the phase change element. The current sensed on the bit line associated with the memory cell being read corresponds to a resistance level of the phase change element, which in turn corresponds to a particular data value, e.g., a binary value such as 1, 0, 001, 11, 1011, etc.

As one of ordinary skill in the art will appreciate, the phase change memory array 100 illustrated in FIG. 1 can be coupled to programming, e.g., write, circuitry and/or sensing, e.g., read, circuitry (not shown in FIG. 1). For instance, the array 100 can be coupled to write and/or read circuitry as described below in connection with FIG. 6.

Figure 2:
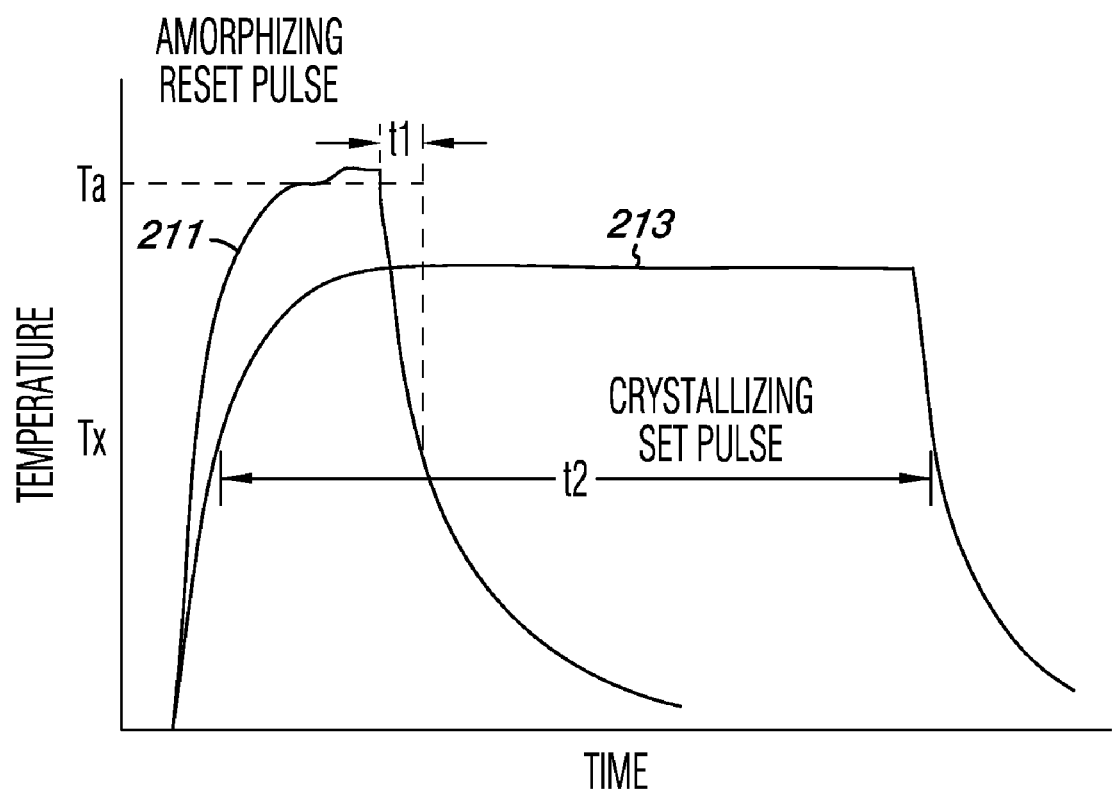
FIG. 2 illustrates an example of pulses that can be used to program phase change memory cells in accordance with one or more embodiments of the present disclosure.

FIG. 2 illustrates an example of pulses that can be used to program phase change memory cells in accordance with one or more embodiments of the present disclosure. In FIG. 2, the pulse 211 represents an amorphizing (reset) pulse, e.g., a pulse used to place one or more phase change memory cells in an amorphous (high resistivity) state. The pulse 213 represents a crystallizing (set) pulse, e.g., a pulse used to place one or more phase change memory cells in a crystalline (low resistivity) state. The reset pulse 211 and the set pulse 213 can be applied to a particular memory cell in order to alter the resistance of the phase change cell structure, e.g., phase change cell structure 104 shown in FIG. 1, by raising/lowering the temperature of the phase change material corresponding to the cell in a manner such that the resistance of the cell is changed, e.g., programmed, to a value that corresponds to a particular desired data state.

As one of ordinary skill in the art will appreciate, a reset pulse such as reset pulse 211 can be used to place the phase change material, e.g., phase change cell structure 104 shown in FIG. 1, or a portion thereof, in a relatively amorphous state corresponding to a relatively high resistance value, e.g., about 100 kiloohm to 1 megaohm. For instance, in the example illustrated in FIG. 1, the reset pulse 211 can be used to raise the temperature of the phase change material to a temperature Ta sufficient to melt the phase change material; the phase change material cools over a short time period, i.e., t1, to amorphize the phase change material such that the phase change material does not re-form some portion of its internal crystalline structure. The time t1 can be referred to as a "quenching time."

A set pulse, such as set pulse 213 illustrated in FIG. 2, can be used to raise the temperature of a phase change material above a temperature Tx and maintain the temperature of the phase change material for a time, e.g., t2, sufficient to allow crystallization of the phase change material to occur. As such, the set pulse 213 can place the phase change material in a relatively crystalline state corresponding to a relatively low resistance value, e.g., about 1 kiloohm to 10 kiloohm, for instance.

Embodiments of the present disclosure are not limited to the reset and/or set pulses illustrated in the example shown in FIG. 2. As an example, one or more embodiments of the present disclosure can provide an electrode encapsulated phase change cell structure which laterally distributes the electric field in the phase change material portion and dissipates heat through the sides that can shorten the quench time, e.g., t1 shown in FIG. 2, associated with a reset pulse, e.g., 211. For instance, various embodiments can increase the quench rate associated with a reset pulse by laterally dissipating heat and improve the reset process by laterally distributing current to facilitate the formation of hemispherical amorphous regions that covers the bottom electrode, which can reduce immature reset. A lateral current distribution also can reduce heat loss through the top electrode and heat-induced top electrode delamination. The encapsulating top electrode can improve thermal isolation of a phase change cell structure from adjacent structures to reduce thermal crosstalk. As one example, in some embodiments, the time for a reset operation can be about 10 ns.

Figure 3:
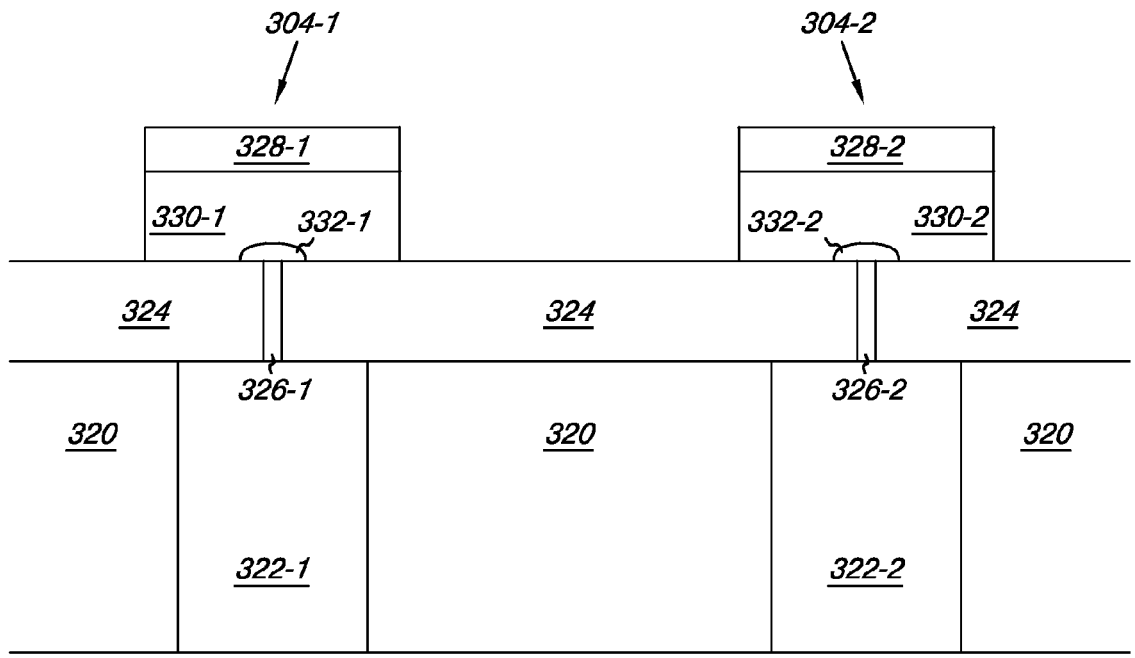
FIG. 3 illustrates a cross-sectional view of a phase change cell structure according to the prior art.

FIG. 3 illustrates a cross-sectional view of a phase change cell structure according to the prior art. The phase change cell structure in FIG. 3 illustrates a structure according to prior art. In FIG. 3, two phase change cell structures 304-1 and 304-2 are formed on metal contacts 322-1 and 322-2 in a dielectric layer 320. The phase change cell structures 304-1 and 304-2 include bottom electrodes 326-1 and 326-2 formed in the substrate 324. The substrate 324 can be silicon nitride (SiN) silicon oxide (SiO), among other suitable substrate materials.

In FIG. 3, the phase change material portions 330-1 and 330-2, which include active regions 332-1 and 332-2, and the top electrodes 328-1 and 328-2 are formed over the substrate 324. The individual phase change cell structures 304-1 and 304-2 are formed by masking a portion of the top electrode material and etching away a portion of the top electrode material and the phase change cell material. The etching of the top electrode material and the phase change cell material to form the phase change cell structures 304-1 and 304-2 exposes the sidewalls of the phase change cell structures 304-1 and 304-2 to ambient oxidation and humidity, along with the etchant. This exposure can contaminate the phase change cell structures causing oxidation, top electrode/phase change material portion interface damage, and introduce contaminates in the phase change material, such as spikes in titanium (Ti). These contaminants can cause degradation of device performance or failure of the device associated with the phase change cell structure.

In addition, the etching of the top electrode material and the phase change cell material to form the phase change cell structure can cause delamination of the phase change material portion from the substrate during the etch cleaning process. The delamination can be caused by the weak adhesion of the phase change material to the substrate under the force exerted by a wet etch solution.

Figure 4:
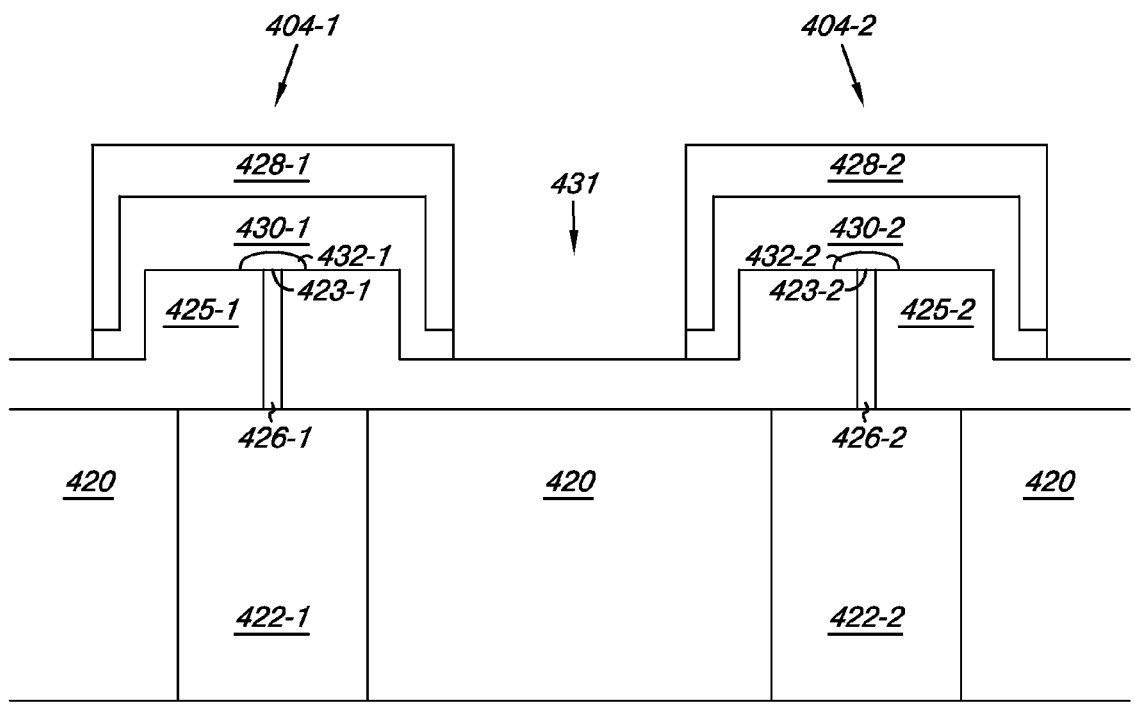
FIG. 4 illustrates a cross-sectional view of a phase change cell structure in accordance with one or more embodiments of the present disclosure.

FIG. 4 illustrates a cross-sectional view of phase change cell structures 404-1 and 404-2 in accordance with one or more embodiments of the present disclosure. The phase change cell structures 404-1 and 404-2 in FIG. 4 illustrate a phase change cell stack that includes substrate protrusions 425-1 and 425-2 encapsulated by phase change material portions 430-1 and 430-2 and phase change material portions 430-1 and 430-2 at least partially encapsulated by top electrodes 428-1 and 428-2. In one or more embodiments, the phase change cell structure 404-1 can be part of a first line stripe configuration and phase change cell structure 404-2 can be part of a second line stripe configuration, wherein the first and second line strip configurations include a number of phase cell structures. In one or more embodiments, the phase change cell structure 404-1 and phase change cell structure 404-2 can each be part of a mesa configuration, wherein each mesa includes a phase change cell structure.

In FIG. 4, the phase change cell structures 404-1 and 404-2 include bottom electrodes 426-1 and 426-2 that are formed in the substrate protrusions 425-1 and 425-2. The bottom electrodes 426-1 and 426-2 are coupled to metal contacts 422-1 and 422-2. The metal contacts 422-1 and 422-5 are formed in a dielectric 420. The phase change cell structures 404-1 and 404-2 are coupled to other elements, such as transistors, diodes, and/or bit lines, among other elements, of a phase change memory array, such as the array illustrated in FIG. 1, via the metal contacts 422-1 and 422-2 and/or the top electrodes 428-1 and 428-2.

In one or more embodiments, the bottom electrodes can have a diameter of approximately 50 nanometers (nm), among other dimensions. The phase change material portion can have a diameter of approximately 100 nm and a depth of approximately 100 nm. Embodiments of the present disclosure are not limited to these examples.

In one or more embodiments, a phase change cell structure, e.g., 404-1, is isolated from another phase change cell structure, e.g., 404-2, by removing a portion of the top electrode material at least partially encapsulating the phase change material and a portion of the phase change material encapsulating the substrate protrusions to expose the substrate. The removal of a portion of the top electrode material and the phase change material can be done by etching. When etching the top electrode material and the phase change material, which encapsulates the phase change material portion and the substrate protrusion 425-1 and 425-2, respectively, the contamination due to plasma, oxidation, and humidity, described in association with the structure illustrated in FIG. 3, is limited to the recess region 431 of the phase change cell structure away from the active switching region of the phase change material portion in FIG. 4. Also, the encapsulated substrate protrusion results in more surface area for the phase change material to adhere to the substrate and substrate protrusion. The electrode encapsulated phase change material portion results in a phase change cell structure that is less susceptible to delamination during fabrication processes, such as the etch clean process.

In various embodiments, the phase change material portion encapsulated by the top electrode can laterally distribute the electric field in the phase change material portion. The laterally distributed electric field can reduce the reset current for the phase change material portion and can also reduce thermal cross talk between adjacent phase change memory cells. In various embodiments, the lateral distribution of the electric field caused by the encapsulated phase change material portion can facilitate the formation of a hemispherical amorphous region, e.g. 432-1 and 432-2 in FIG. 4, that covers the upper surface, e.g., 423-1 and 423-2 in FIG. 4, of the bottom electrode. A hemispherical amorphous region that covers the bottom electrode can reduce and/or prevent unwanted and/or premature reset of the phase change material. The lateral electric field distribution can also reduce heat loss through the top electrode and reduce heat-induced top electrode delamination. The top electrode encapsulating the phase change material portion can also thermally isolate the phase change material more efficiently to reduce thermal cross talk between adjacent phase change memory cells.

FIGS. 5A-5D are cross-sectional views illustrating formation of phase change cell structures 504-1 and 504-2 in accordance with one or more embodiments of the present disclosure. The phase change cell structures 504-1 and 504-2 described in FIGS. 5A-5D includes a portion of a number of phase change cell structures at various stages in a fabrication sequence.

Figure 5A:
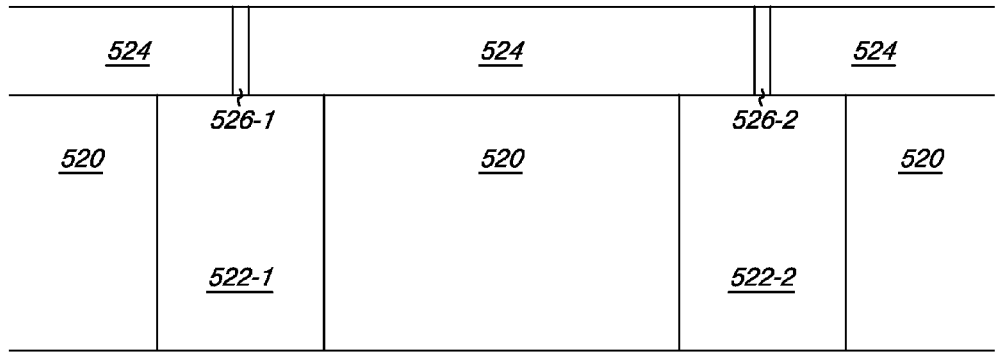
FIGS. 5A-5D are cross-sectional views illustrating formation of a phase change cell structure in accordance with one or more embodiments of the present disclosure.

FIG. 5A shows two phase change cell structures at a particular stage in a phase change memory device fabrication sequence. The embodiment illustrated in FIG. 5A includes a dielectric 520 with metal contacts 522-1 and 522-2, which phase change cell structures 504-1 and 504-2 illustrated in FIG. 5D are fabricated upon. The metal contacts 522-1 and 522-2 can be formed by forming an opening in the dielectric 520 and filling the opening with a conductor, such as metals and/or metal alloys including titanium (Ti), tungsten (W), or tantalum (Ta), among other conductors. The metal and/or metal alloy can be planarized using chemical mechanical planarization (CMP) or other suitable planarization techniques to create a planar surface that includes the top surface of the dielectric 520 and the metal contacts 522-1 and 522-2. The metal contacts 522-1 and 522-2 can provide an electrical and thermal conductive path to couple the phase change cell structures to other elements in the phase change memory cell, such as a transistor, diode, and/or a bit line, among other elements.

In FIG. 5A, a substrate 524 can be formed on the dielectric 520 and metal contacts 522-1 and 522-2. An opening can be formed in the substrate 524 by removing a portion of the substrate 524 to the metal contacts 522-1 and 522-2 via etching. The bottom electrodes 526-1 and 526-2 can be formed by filling the openings in the substrate with the bottom electrode material.

Figure 5B:
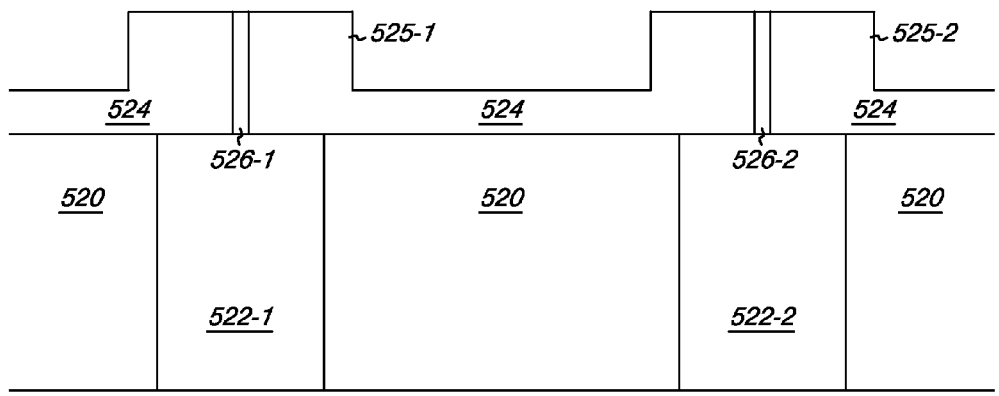

In FIG. 5B, substrate protrusions 525-1 and 525-2 are formed. A portion of the substrate 524 is removed to form the substrate protrusions 525-1 and 525-2. In various embodiments, the substrate 524, e.g., as shown in FIG. 5A, is photo masked to protect the substrate protrusion and the substrate is etched to a certain depth leaving a portion of the substrate 524 that forms the substrate protrusions 525-1 and 525-2. Substrate protrusions 525-1 and 525-2 can provide the base for the formation of the encapsulated phase change material portion, e.g., as shown in FIG. 5C.

Figure 5C:
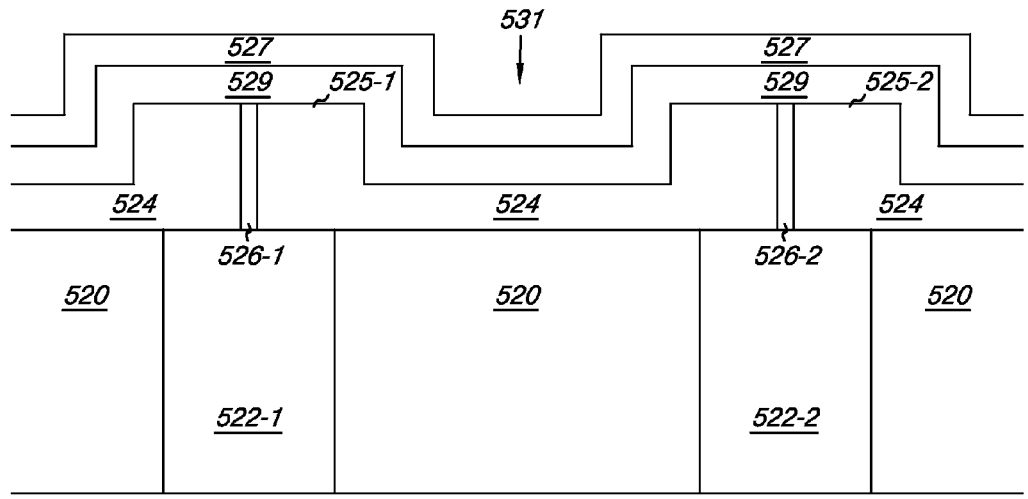
Figure 5D:
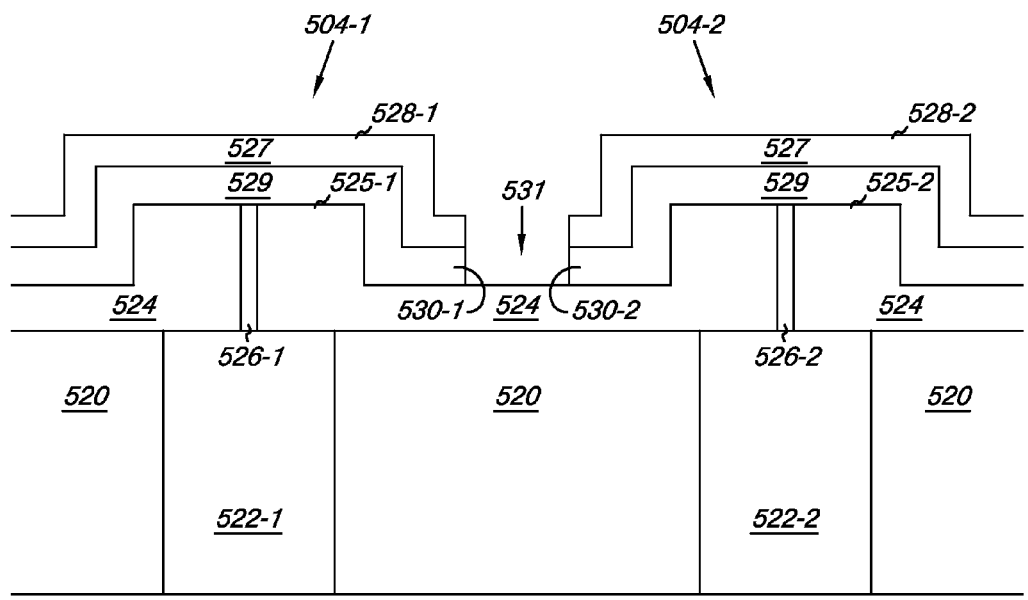

FIG. 5C shows two phase change cell structures at a particular stage in a phase change memory device fabrication sequence. In FIG. 5C, a phase change material 529 is formed over the substrate protrusions 525-1 and 525-2 to encapsulate the substrate protrusions 525-1 and 525-2. The substrate protrusions 525-1 and 525-2 can include sidewalls that can be covered by the phase change material 529. A top electrode 527 is formed over the phase change material 529. The phase change material 529 can include sidewalls that are covered by the top electrode 527. The top electrode 527 can encapsulate at least the active region of the phase change material portion, e.g., phase change material portions 530-1 and 530-2 shown in FIG. 5D. The phase change material 529 and the top electrode 527 can be formed using a conformal deposition process, such as atomic layer deposition (ALD) and/or a non-conformal deposition process, such as physical vapor deposition (PVD), among other processes. The formation of the phase change material and the top electrode over the substrate protrusions 525-1 and 525-2 can create a recess 531 between the phase change cell structures. The recess 531 can be used to execute further process steps on the phase change cell structures that are away from the active region of the phase change material portion. For example, further etching and cleaning of the phase change cell structures after formation of the recess will not harm the active portion of the phase change cell structure.

FIG. 5D shows two phase change structures at a particular stage in a phase change memory device fabrication sequence.

In FIG. 5D, phase change cell structures 504-1 and 504-2 are formed and isolated from each other. Phase change material portion 530-1 and top electrode 528-1 are isolated from phase change material portion 530-2 and top electrode 528-2 by removing a portion of the phase change material 529 and the top electrode 527 in the recess 531 between the substrate protrusions 525-1 and 525-2. In one or more embodiments, the portion of the phase change material 529 and the top electrode 527 can be removed by etching. In one or more embodiments, a portion of the phase change material 529 and the top electrode 527 can be photo patterned and then a portion of the phase change material 529 and the top electrode 527 can be removed by etching. The removal of a portion of the phase change material 529 and the top electrode 527 can isolate the phase change cell structures 504-1 and 504-2 by exposing a portion of the substrate 524.

Methods and devices associated with phase change cell structures are described herein. In one or more embodiments, a method of forming a phase change cell structure includes forming a substrate protrusion that includes a bottom electrode, forming a phase change material on the substrate protrusion, forming a conductive material on the phase change material, and removing a portion of the conductive material and a portion of the phase change material to form an encapsulated stack structure.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. As used herein, the term "and/or" includes any and all combinations of one or more of the associated listed items.

It will be understood that, although the terms first, second, etc. may be used herein to describe various elements and that these elements should not be limited by these terms. These terms are only used to distinguish one element from another element. Thus, a first element could be termed a second element without departing from the teachings of the present disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure.

It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method of forming a phase change cell structure, the method comprising:
    forming a bottom electrode in a substrate material;
    forming a substrate protrusion that includes the bottom electrode by removing portions of the substrate material while maintaining encapsulation of the bottom electrode with the substrate material;
    forming a phase change material on the substrate protrusion;
    forming a conductive material on the phase change material; and
    removing a portion of the conductive material and a portion of the phase change material to form an encapsulated stack structure, wherein removing the portion of the conductive material and the portion of the phase change material isolates the encapsulated stack structure from an adjacent encapsulated stack structure.

2. The method of claim 1, wherein the method includes forming the substrate protrusion by photo patterning a substrate and etching the substrate.

3. The method of claim 1, including forming the phase change material using a non-conformal deposition method.

4. The method of claim 1, including forming the conductive material using a non-conformal deposition method.

5. A method of forming a phase change memory structure, the method comprising:
    forming a first phase change cell stack on a substrate, wherein the first phase change cell stack includes a phase change material portion that encapsulates a first substrate protrusion and a top electrode formed on the phase change material portion;
    forming a second phase change cell stack on the substrate, wherein the second phase change cell stack includes the phase change material portion that encapsulates a second substrate protrusion and the top electrode formed on the phase change material portion; and
    isolating the first phase change cell stack from the second phase change cell stack by removing a portion of the top electrode and a portion of the phase change material portion; and
    wherein forming the first phase change cell stack includes:
        forming a first bottom electrode in a substrate material; and
        forming the first substrate protrusion by removing portions of the substrate material while maintaining encapsulation of the first bottom electrode with the substrate material.

6. The method of claim 5, including forming the top electrode such that the top electrode encapsulates the phase change material portion.

7. The method of claim 5, including etching the phase change material portion and the top electrode to expose the substrate.

8. The method of claim 5, wherein the method includes forming the first phase change cell stack by forming the first bottom electrode in the first substrate protrusion and forming the second phase change cell stack by forming a second bottom electrode in the second substrate protrusion.

9. The method of claim 8, including forming the first phase change cell stack on a first metal contact and forming the second phase change cell stack on a second metal contact.

10. The method of claim 9, including coupling the first bottom electrode to the first metal contact and coupling the second bottom electrode to a second metal contact.

* * * * *